United States Patent [19]
Yang et al.

[11] Patent Number: 5,352,293
[45] Date of Patent: Oct. 4, 1994

[54] TUBE APPARATUS FOR MANUFACTURING SEMICONDUCTOR DEVICE

[75] Inventors: Chang-jip Yang; Kyu-bok Ryu; Jung-soo An; Jun-geen An, all of Kyungki-do, Rep. of Korea

[73] Assignee: Samsung Electronics Co., Ltd., Kyungki-do, Rep. of Korea

[21] Appl. No.: 870

[22] Filed: Jan. 6, 1993

[30] Foreign Application Priority Data

Jan. 6, 1992 [KR] Rep. of Korea .................. 92-54

[51] Int. Cl.⁵ ............................................ C23C 16/00
[52] U.S. Cl. .................................. 118/715; 118/725; 118/733; 156/345
[58] Field of Search .................. 118/715, 725, 733; 156/345

[56] References Cited

U.S. PATENT DOCUMENTS

| | | | |
|---|---|---|---|
| 3,314,393 | 4/1967 | Hanata | 118/725 |
| 4,472,622 | 9/1984 | Satoh | 118/725 |
| 4,487,161 | 12/1984 | Hirata | 118/725 |
| 4,640,223 | 2/1987 | Dozier | 118/725 |
| 4,732,110 | 3/1988 | Parsons | 118/725 |
| 4,753,192 | 6/1988 | Goldsmith | 118/725 |
| 4,793,283 | 12/1988 | Sarkozy | 118/725 |
| 4,803,948 | 2/1989 | Nakagawa | 118/725 |
| 4,962,726 | 10/1990 | Matsushita | 118/725 |
| 5,064,367 | 11/1991 | Philipossian | 118/725 |

*Primary Examiner*—Richard Bueker
*Attorney, Agent, or Firm*—Cushman, Darby & Cushman

[57] ABSTRACT

The present invention relates to a tube apparatus for manufacturing a semiconductor device, comprising a one-piece cylindrical tube having a door for loading a semiconductor wafer. One end of the tube is closed and two openings are formed adjacent thereto. The other end is conical and has an opening formed in the apex thereof. A saddle having two openings is mounted on the tube so that the two openings of the saddle correspond to the two openings of the tube which are adjacent to the closed end. Using the tube apparatus enhances the efficiency of a diffusion process. Contaminant residue does not remain in the process tube because the temperature therein is more uniform over the length of the tube, compared to a conventional apparatus. The tube can therefore be used semi-permanently.

7 Claims, 3 Drawing Sheets

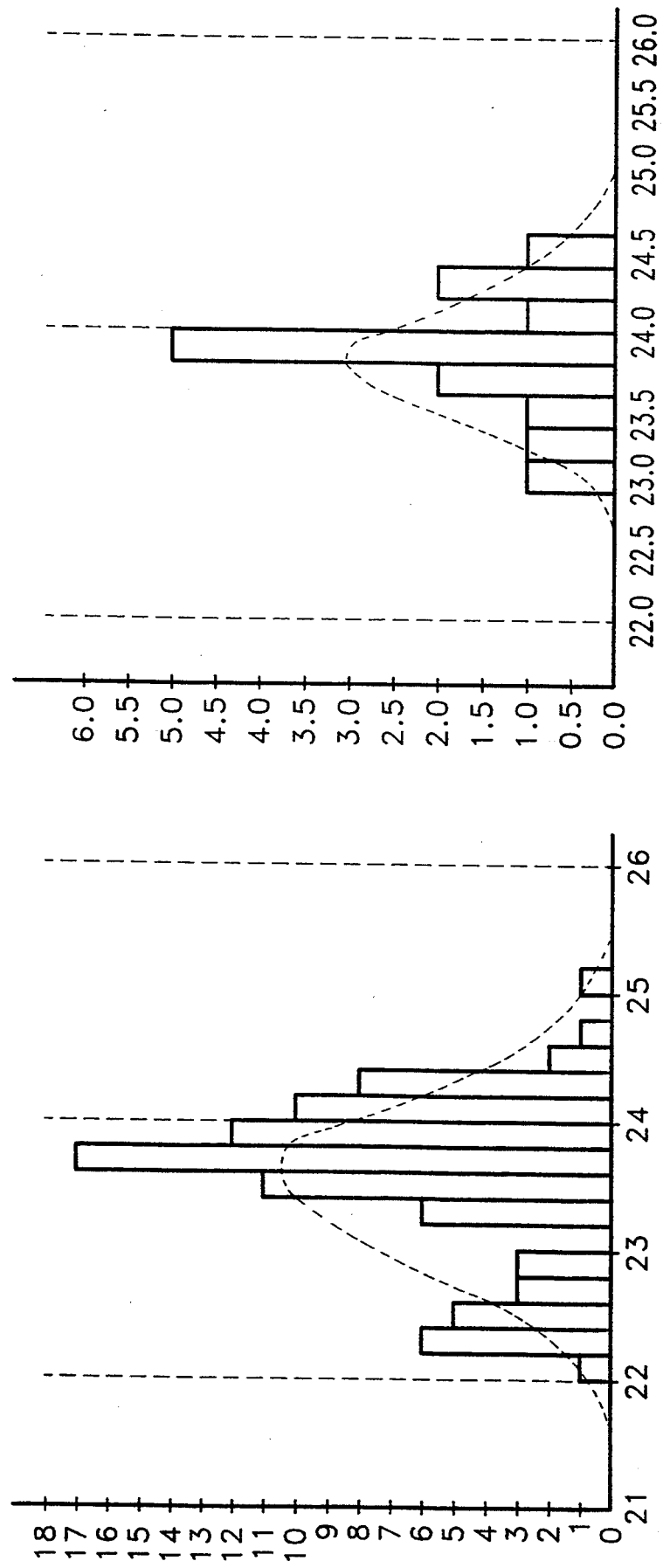

TUBE APPARATUS FOR MANUFACTURING SEMICONDUCTOR DEVICE

BACKGROUND OF THE INVENTION

The present invention relates to an apparatus for manufacturing a semiconductor device, and more particularly, to a tube apparatus used to grow a layer or diffuse a dopant in manufacturing a semiconductor device.

In manufacturing a semiconductor device, a tube made of quartz is employed in order to grow various structural layers or diffuse a dopant. A quartz tube is generally constituted by a process quartz tube (hereinafter referred to as a process tube) having a silicon wafer for processing, and a dummy tube for venting the gas remaining after the processing.

A process tube is utilized in reacting the reactant gases entering via a gas inlet hole on the silicon wafer to grow a desired layer, or in diffusing doped impurities. The dummy tube is mounted on the process tube and has an outlet hole for venting non-reacted gas remaining in the process tube after reaction, or by-products produced by the reaction. Nitrogen gas is introduced into the dummy tube via a nitrogen curtain tube so that constant pressure in the process tube is maintained, and so that contaminants are prevented from being introduced into the process tube from the outside.

FIG. 1 is a sectional view of a conventional tube apparatus during diffusion process, and FIG. 2 is a cross-sectional view of the tube apparatus of FIG. 1 taken along line A—A'.

In FIGS. 1 and 2, reference number 1 denotes the process tube, 2 denotes a dummy tube, 3 denotes a gas outlet hole, 4 denotes a connecting portion of the process tube 1 and the dummy tube 2, 5 denotes a nitrogen curtain tube, 6 denotes a reactant gas inlet hole, 7 denotes a residue remaining in the dummy tube 2, and 8 denotes a reactant gas.

Firstly, a semiconductor wafer (not shown) is mounted on the process tube 1, and reactant gas 8 is introduced via gas inlet hole 6. At this time, nitrogen gas is introduced into the dummy tube 2 via nitrogen curtain tube 5 and forms a nitrogen curtain in the process tube 1. Reactant gas 8 introduced via gas inlet hole 6 grows a desired layer on the wafer or diffuses doped impurities. The nitrogen gas introduced via nitrogen curtain tube 5 maintains constant pressure in the process tube 1 and prevents the reactant gas 8 from coming into contact with the outside, so that contaminants are prevented from being introduced into the process tube 1.

After the process, non-reacted gas and reaction by-products are vented to the outside via the gas outlet hole 3 of the dummy tube 2.

In the conventional tube apparatus as above, the process tube 1 and the dummy tube 2 are connected to each other and have different temperature variations. For example, the temperature of dummy tube 2 may be lower than that of process tube 1. Accordingly, the high temperature reactant gas and the reaction by-products from the process tube 1 condense to form residue 7 on the inner wall of the dummy tube 2. This residue 7 becomes a contaminant source when the wafer is loaded or unloaded into the process tube 1. Also, since the process tube 1 and the dummy tube 2 are connected to each other, a fine chink or seam exists therebetween. Therefore, not only is heat lost through this chink, but reactant gas also leaks out of this chink to react with vapor in the ambient air so that a strong acidic material forms and solidifies. The process tube 1 and the dummy tube 2 must be firmly coupled, so that they cannot be separated. Therefore, re-using them is difficult. Additionally, since the connection between the process tube 1 and the dummy tube 2 is very important, great care must be taken in process maintenance, which is very time-consuming.

The present inventors have taken the aforementioned problem into consideration and thus accomplished the present invention.

SUMMARY OF THE INVENTION

The object of the present invention is to provide a novel tube apparatus for manufacturing a semiconductor device which prevents unstable processing due to inadequate component connection and can be handled easily.

A tube apparatus for manufacturing a semiconductor device comprises a cylindrical tube having a door for mounting a semiconductor wafer, wherein one end of the tube is closed and two openings are formed near the one end. The other end is conic and an opening is formed in the tip thereof.

A saddle having two openings is preferably mounted on the tube by any suitable method so that the openings correspond to the two openings of the tube placed near the closed end.

In the tube apparatus of the present invention, the diffusion process is easy and reactant gas residue does not remain in the process tube because the temperature therein is more uniform over the length of the tube.

BRIEF DESCRIPTION OF THE DRAWINGS

Further features and advantages will become more apparent from the following description of the preferred embodiment of the invention, as illustrated in the accompanying drawings, in which the same reference characters generally refer to like parts throughout the views, and in which:

FIG. 7 is a graph showing the processing ability index obtained using a conventional tube apparatus; and FIG. 8 is a graph showing the processing ability index obtained using a tube apparatus of the present invention.

DETAILED DESCRIPTION OF THE INVENTION

Figure 4:
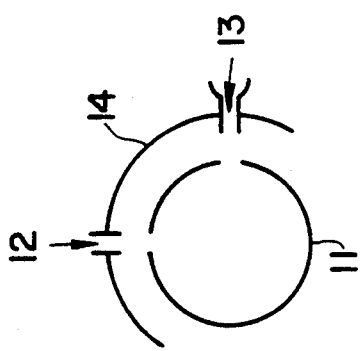
FIG. 4 is a schematic view of the closed end of the tube apparatus of FIG. 3 taken along line B—B'.
Figure 2:
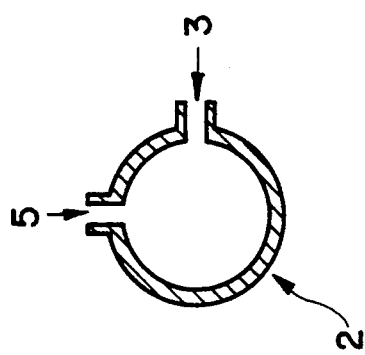
FIG. 2 is a cross-sectional view of the tube apparatus of FIG. 1, taken along line A—A'.
Figure 3:
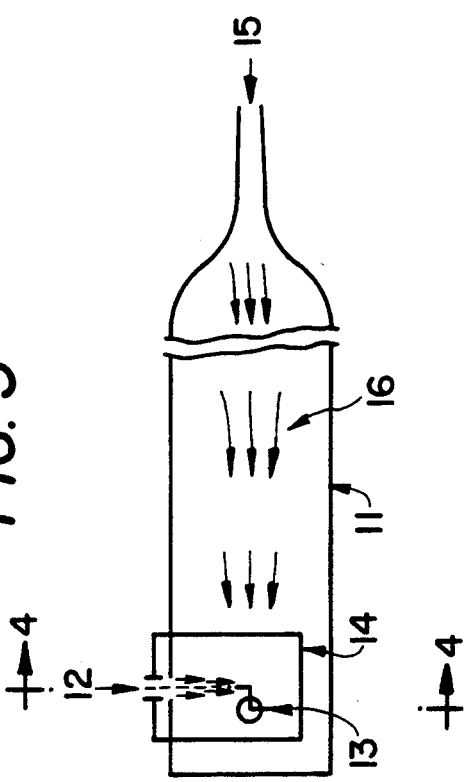
FIG. 3 is a schematic view of a tube apparatus mounted with a saddle of the present invention.
Figure 1:
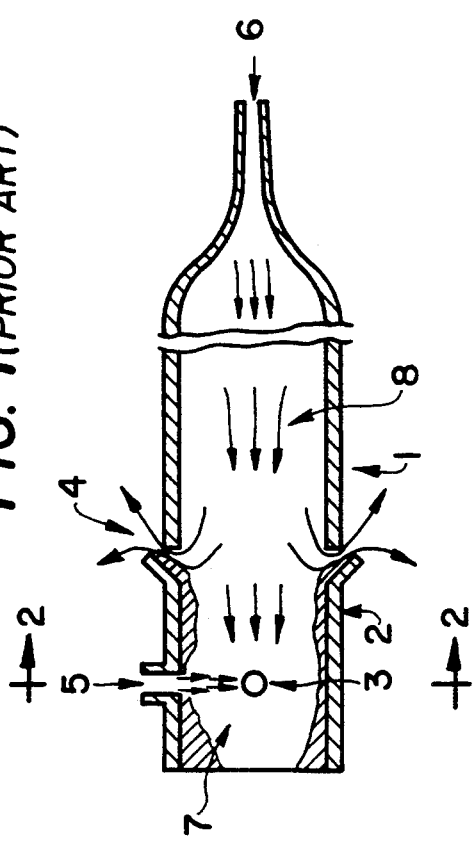
FIG. 1 is a sectional view of a conventional tube apparatus during a diffusion process.

FIG. 3 is a schematic view of a tube apparatus mounted with a saddle of the present invention during diffusion process. FIG. 4 is a schematic view of the closed end of the tube apparatus of FIG. 3, taken along line B—B'. In FIGS. 3 and 4, reference number 11 denotes a process tube, 12 denotes a nitrogen gas inlet hole, 13 denotes a gas outlet hole, 14 denotes a saddle, 15 denotes a reactant gas inlet hole, and 16 denotes a reactant gas.

The tube apparatus of the present invention has a cylindrical process tube 11 with a door (not shown) for loading a semiconductor wafer. One end of the process tube 11 is closed and the other end is conical. An opening 15 is formed in the apex of the cone, and two openings, 12 and 13, are formed near the closed end of the process tube 11. Opening 15 formed at the cone is a reactant gas inlet hole, through which a reactant gas is introduced into the process tube 11. The process tube 11 of the present invention is made of a quartz having a good heat resistance and chemical resistance. The process tube 11 is a one-piece or seamless tube, in the sense that there is no seam between what would otherwise be separate process and dummy sections, as in the conventional apparatus.

Nitrogen gas is introduced into the process tube 11 via nitrogen gas inlet hole 12, so that the reactant gas is prevented from coming into contact with the ambient air and so that constant pressure in the process tube is maintained.

Figure 5:
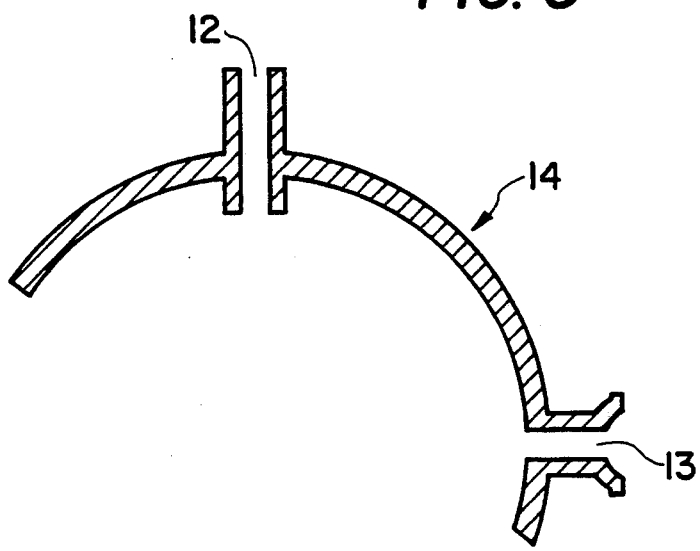
FIG. 5 is a sectional view of a saddle mounted on the tube apparatus of the present invention.
Figure 6:
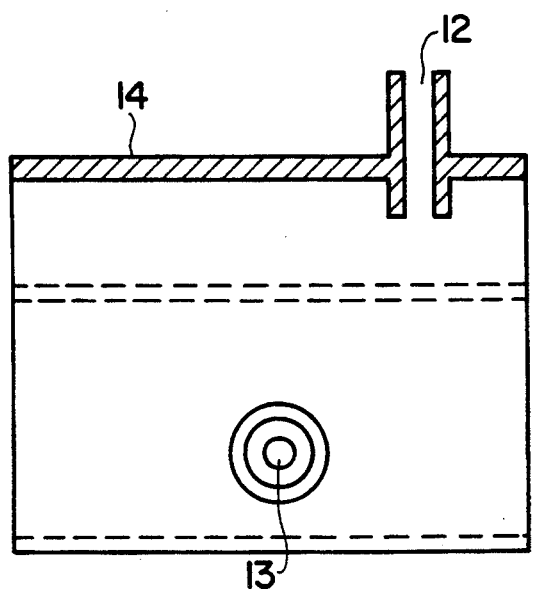
FIG. 6 is a side view of the saddle.

The process tube apparatus 11 of the present invention is provided with a saddle 14. FIG. 5 is a sectional view of saddle 14, and FIG. 6 is a side view of the saddle. Saddle 14 has two openings 12a and 13a which correspond to openings 12 and 13 placed near the closed end of the process tube 11. Saddle 14 is mounted by any known and suitable method on the process tube so openings 12a and 13a correspond to the two process openings 12 and 13.

FIG. 7 is a graph showing the processing ability index obtained when the diffusion process is carried out using a conventional tube apparatus, and FIG. 8 is a graph showing the processing ability index obtained using a process tube apparatus of the present invention. In FIGS. 7 and 8, the vertical axis shows the unit number in measuring the sheet resistance of the wafer, while the horizontal axis shows the sheet resistance of the wafer ($\Omega/\square$) measured after the diffusion process. Here, the predetermined sheet resistance value of the diffusion process was $24\Omega/\square$.

The average sheet resistance of the wafer is $23.573\Omega/\square$ when using a conventional tube apparatus, and $23.845\Omega/\square$ when using the tube apparatus of the present invention. Also, the standard deviation is 0.65 when using a conventional tube apparatus, and 0.39 when using the tube apparatus of the present invention. Cp is obtained by means of the standard deviation, using the following equation.

$$C_p = \frac{\text{standard deviation}}{\text{maximum value} - \text{average}}$$

After determining the value of $C_p$, processing ability index $C_{pk}$ is determined by the following equation.

$$C_{pk} = k|1 - k| \times C_p$$
$$\left(\text{wherein } k = \frac{\text{set value} - \text{average}}{2}\right)$$

The processing ability index obtained by the above equation is 0.83 when using a conventional tube apparatus, and 1.59 when using the process tube apparatus of the present invention. The above result is shown in the following Table 1.

TABLE 1

|  | conventional tube apparatus | tube apparatus of the present invention |
|---|---|---|
| standard deviation | 0.65 | 0.39 |
| $C_{pk}$ | 0.83 | 1.59 |

As evident from the above, the diffusion process is very stable when the process is carried out using a process tube apparatus of the present invention. Reactant gas residue does not remain in the process tube because the temperature therein is more uniform over the length of the tube, compared to what is conventionally used.

Also, since the saddle can be easily mounted on the process tube, it can be handled with ease. Furthermore, in a conventional tube apparatus, when reactant gas residue remains on the connecting portion of a dummy tube and a process tube, the dummy tube and the process tube cannot be separated, so the conventional tube apparatus cannot be used again. However, in the tube apparatus of the present invention, the saddle and process tube can be separated easily and residue is not formed in the process tube. When a residue forms on the inner surface of the saddle, it can be easily removed. Therefore, the tube apparatus of the present invention is semi-permanent.

Having described a preferred embodiment of the present invention, it will be clear to those skilled in the art that modifications and alternatives to the disclosed apparatus exist within the scope and spirit of the present invention. Accordingly, it is intended to limit the scope of the present invention only as indicated in the following claims.

What is claimed is:

1. A tube apparatus for manufacturing a semiconductor device comprising:
   (a) a one-piece cylindrical tube having means for loading a semiconductor wafer, said tube having a first closed end with first and second openings formed adjacent to said first closed end, said tube further having a second end with an opening formed therein; and
   (b) a saddle portion conformally mounted on a portion of an exterior surface of said tube, said saddle portion having first and second openings, wherein said saddle portion is mounted on said tube such that said first and second openings of said saddle portion positionally correspond to said first and second openings of said tube adjacent to said closed end.

2. A tube apparatus as claimed in claim 1, wherein said first and second openings adjacent to said closed end of said tube are a nitrogen curtain gas inlet hole and a gas outlet hole, respectively.

3. A tube apparatus as claimed in claim 1, wherein said opening at said second end of said tube is a reactant gas inlet hole.

4. A tube apparatus as claimed in claim 1, wherein said tube is made of a heat resistant and chemical resistant quartz material.

5. A tube apparatus as claimed in claim 1, wherein said tube is used for growing a layer.

6. A tube apparatus as claimed in claim 1, wherein said tube is used for diffusing a dopant.

7. A tube apparatus as claimed in claim 2, wherein said gas outlet hole is used for venting non-reacted gas and reaction by-products.

* * * * *